(12) United States Patent
Adamson et al.

(10) Patent No.: US 7,096,727 B2
(45) Date of Patent: Aug. 29, 2006

(54) SYSTEM AND METHOD FOR GENERATING ELECTRIC POWER FROM A ROTATING TIRE'S MECHANICAL ENERGY

(75) Inventors: John David Adamson, Simpsonville, SC (US); George Phillips O'Brien, Piedmont, SC (US)

(73) Assignee: Michelin Recherche et Technique S.A., (CH)

( * ) Notice: Subject to any disclaimer, the term of this patent is extended or adjusted under 35 U.S.C. 154(b) by 29 days.

(21) Appl. No.: 10/850,860

(22) Filed: May 21, 2004

(65) Prior Publication Data
US 2004/0211250 A1 Oct. 28, 2004

Related U.S. Application Data

(63) Continuation-in-part of application No. 10/143,535, filed on May 10, 2002, now Pat. No. 6,807,858.

(51) Int. Cl.
*G01M 17/02* (2006.01)
(52) U.S. Cl. .......................................... 73/146; 307/44
(58) Field of Classification Search .................. 73/146, 73/146.5; 307/44, 46
See application file for complete search history.

(56) References Cited

U.S. PATENT DOCUMENTS

| | | | |
|---|---|---|---|
| 3,760,351 A | 9/1973 | Thomas | |
| 4,061,200 A | 12/1977 | Thompson | |
| 4,160,234 A * | 7/1979 | Karbo et al. | 340/443 |
| 4,510,484 A | 4/1985 | Snyder | |
| 4,862,486 A | 8/1989 | Wing et al. | |
| 5,457,447 A | 10/1995 | Ghaem et al. | |
| 5,473,938 A * | 12/1995 | Handfield et al. | 73/146.5 |
| 5,546,070 A | 8/1996 | Ellmann et al. | |
| 5,570,286 A * | 10/1996 | Margolis et al. | 701/36 |
| 5,632,841 A | 5/1997 | Hellbaum et al. | |
| 5,639,850 A | 6/1997 | Bryant | |
| 5,749,984 A | 5/1998 | Frey et al. | |

(Continued)

FOREIGN PATENT DOCUMENTS

GB 2307044 A 5/1997

(Continued)

OTHER PUBLICATIONS

EPO Search Report dated Aug. 26, 2003.

(Continued)

*Primary Examiner*—Edward Lefkowitz
*Assistant Examiner*—Andre Allen
(74) *Attorney, Agent, or Firm*—Dority & Manning PA

(57) ABSTRACT

A tire assembly with integrated power generation features includes one or more piezoelectric devices and power conditioning modules. Piezoelectric devices may include a plurality of piezoelectric fibers embedded in a generally unidirectional fashion within an epoxy matrix, a piezoceramic wafer provided on a substrate and substantially surrounded by a protective casing, or a piezoceramic unimorph structure adhered with a thermoplastic polyimide to respective top and bottom conductive layers. Each piezoelectric device may include multiple piezoelectric elements connected in series and/or parallel arrangements, configured with respective poling directions in opposing or in-phase arrangements and/or configured in d33 or d31 displacement modes. Piezoelectric devices are preferably mounted within a tire or wheel assembly such that electric charge is generated therein as the wheel assembly moves along a ground surface and is subsequently stored in one or more energy storage devices. Stored energy may then be used to power electronics such as a tire monitoring system that wirelessly transmits such information as tire pressure, temperature and identification variables to a remote receiver location.

39 Claims, 10 Drawing Sheets

U.S. PATENT DOCUMENTS

| | | | |
|---|---|---|---|
| 5,781,104 A | 7/1998 | Huang | |
| 5,869,189 A | 2/1999 | Hagood, IV et al. | |
| 6,048,622 A | 4/2000 | Hagood, IV et al. | |
| 6,175,302 B1 | 1/2001 | Huang | |
| 6,438,193 B1 | 8/2002 | Ko et al. | |
| 6,725,713 B1* | 4/2004 | Adamson et al. | 73/146.5 |
| 6,807,853 B1* | 10/2004 | Adamson et al. | 73/146 |
| 6,847,126 B1* | 1/2005 | Adamson et al. | 290/1 R |
| 2003/0011276 A1 | 1/2003 | Nowottnick | |
| 2003/0209063 A1* | 11/2003 | Adamson et al. | 73/146 |
| 2003/0209064 A1* | 11/2003 | Adamson et al. | 73/146 |
| 2004/0164558 A1* | 8/2004 | Adamson et al. | 290/1 R |
| 2005/0116545 A1* | 6/2005 | Hamel et al. | 307/46 |
| 2005/0140212 A1* | 6/2005 | Hamel et al. | 307/44 |
| 2005/0146220 A1* | 7/2005 | Hamel et al. | 307/44 |

FOREIGN PATENT DOCUMENTS

| | | |
|---|---|---|
| GB | 2325303 A | 11/1998 |
| WO | 0168388 | 9/2001 |
| WO | 0180327 | 10/2001 |

OTHER PUBLICATIONS

*Piezoelectric Powered (Batteryless) Radio Frequency Indentification Tag For Tires*, pp. 245-246, IBM Technical Disclosure Bulletin, vol. 39 No. 8 Aug. 1996.

Michael Patrick Johnson, *Physical Limits of Portable Power Storage*, May 1999, MIT Media Lab, Cambridge, MA.

George A. Rossetti, Jr., Allesandro Pizzochero, and Aaron A. Bent, *Recent Advances in Active Fiber Composites Technology*, Aug. 17, 2000, 12th IEEE International Symposium on the Applications of Ferroelecrics (ISAF 2000).

John Kymissis, Clyde Kendall, Joseph Paradiso, and Neil Gershenfeld, *Parasitic Power Harvesting in Shoes*, Aug. 1998, Presented at the Second IEEE International Conference on Wearable Computing.

T. Starner, *Human-Powered Wearable Computing*, 1996, IBM Systems Journal, vol. 35, Nos. &4.

J.A. Paradiso, K. Hsiao, A.Y. Benbasat, and Z. Teegarden, *Design and Implementation of Expressive Footwear*, 2000, IBM Systems Journal, vol. 39, Nos. #&4.

Web page link for a device QP15W from Mide, Oct. 13, 2003.

Application Notes for Thunder® device, Face International Corporation, Copyright date 2002.

* cited by examiner

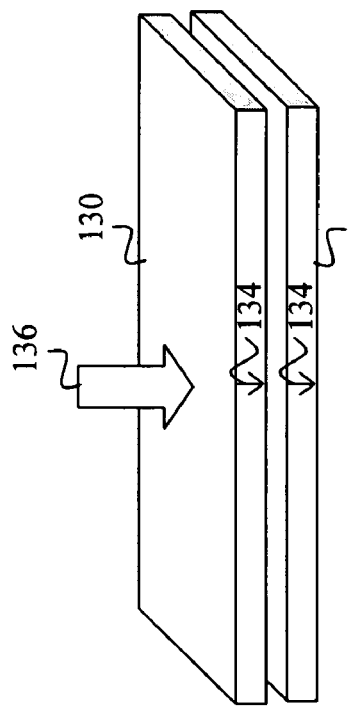
*Figure 7A*
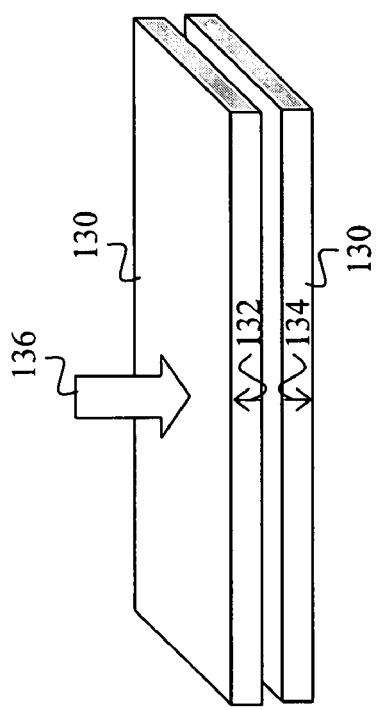
*Figure 7C*
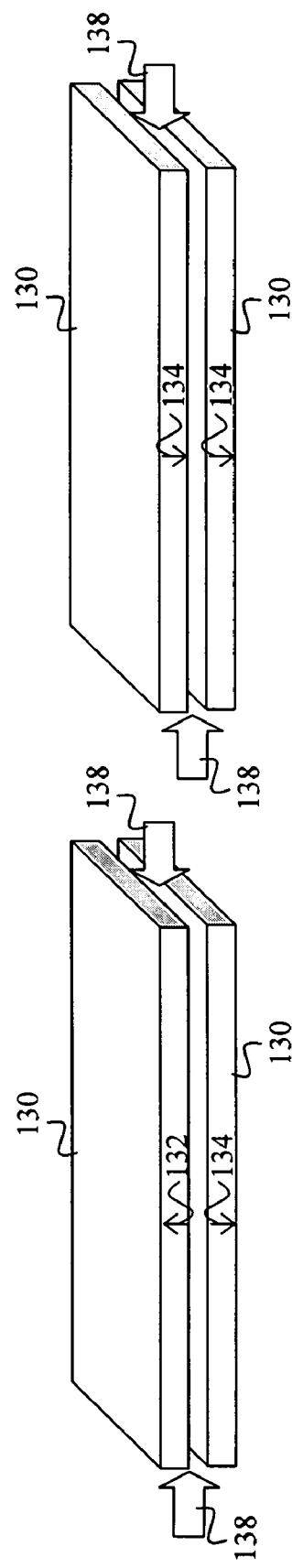
*Figure 7B*
*Figure 7D*

SYSTEM AND METHOD FOR GENERATING ELECTRIC POWER FROM A ROTATING TIRE'S MECHANICAL ENERGY

PRIORITY CLAIM

This application is a Continuation-In-Part of previously filed U.S. patent application entitled "SYSTEM AND METHOD FOR GENERATING ELECTRIC POWER FROM A ROTATING TIRE'S MECHANICAL ENERGY USING PIEZOELECTRIC FIBER COMPOSITES," with the same inventors as present, assigned U.S. Ser. No. 10/143,535, filed on May 10, 2002 now U.S. Pat. No. 6,807,858, and which is incorporated herein by reference for all purposes.

FIELD OF THE INVENTION

The present invention generally concerns a system and method of subjecting piezoelectric structures to the mechanical energy of conventional tire rotation, thereby generating electric power for integrated tire electronics. Piezoelectric technology is utilized to convert mechanical strain associated with tire flexure to electric charge that is then conditioned and stored in an energy storage device. Sufficient accumulations of such stored energy can then power electronic systems including components for identifying various physical tire parameters as well as radio frequency (RF) transmission devices.

BACKGROUND OF THE INVENTION

The incorporation of electronic devices with pneumatic tire structures yields many practical advantages. Tire electronics may include sensors and other components for obtaining information regarding various physical parameters of a tire, such as temperature, pressure, number of tire revolutions, vehicle speed, etc. Such performance information may become useful in tire monitoring and warning systems, and may even potentially be employed with feedback systems to regulate proper tire pressure levels.

U.S. Pat. No. 5,749,984 (Frey et al.) discloses a tire monitoring system and method that is capable of determining such information as tire deflection, tire speed, and number of tire revolutions. Another example of a tire electronics system can be found in U.S. Pat. No. 4,510,484 (Snyder), which concerns an abnormal tire condition warning system. U.S. Pat. No. 4,862,486 (Wing et al.) also relates to tire electronics, and more particularly discloses an exemplary revolution counter for use in conjunction with automotive and truck tires.

Yet another potential capability offered by electronics systems integrated with tire structures corresponds to asset tracking and performance characterization for commercial vehicular applications. Commercial truck fleets, aviation crafts and earthmover/mining vehicles are all viable industries that could utilize the benefits of tire electronic systems and related information transmission. Tire sensors can determine the distance each tire in a vehicle has traveled and thus aid in maintenance planning for such commercial systems. Vehicle location and performance can be optimized for more expensive applications such as those concerning earth mining equipment. Entire fleets of vehicles could be tracked using RF tag transmission, exemplary aspects of which are disclosed in U.S. Pat. No. 5,457,447 (Ghaem et al.).

Such integrated tire electronics systems have conventionally been powered by a variety of techniques and different power generation systems. Examples of mechanical features for generating energy from tire movement are disclosed in U.S. Pat. No. 4,061,200 (Thompson) and U.S. Pat. No. 3,760,351 (Thomas). Such examples provide bulky complex systems that are generally not preferred for incorporation with modern tire applications.

Some tire electronics systems have been powered by various piezoelectric devices. U.S. Pat. No. 6,438,193 (Ko et al.) discloses a self-powered tire revolution counter that includes a piezoelectric element mounted in a tire in a manner so as to be subjected to periodic mechanical stresses as the tire rotates and to provide periodic pulses in response thereto. Yet another example of piezoelectric devices used for powering tire electronics systems is disclosed in U.S. Pat. No. 4,510,484 (Snyder), which concerns a piezoelectric reed power supply symmetrically configured about a radiating center line of a tire.

Another typical solution for powering tire electronics systems corresponds to the use of a non-rechargeable battery, which inherently provides an inconvenience to the tire user since proper electronics system operation is dependent on periodic battery replacement. Conventional batteries also often contain heavy metals that are not environmentally friendly and which present disposal concerns, especially when employed in highly numerous quantities. Still further, batteries tend to deplete their energy storage quite rapidly when powering electronic applications characterized by complex levels of functionality. Battery storage depletion is especially prevalent in electronic systems that transmit information over a relatively far distance such as from truck wheel locations to a receiver in the truck cabin. Even when batteries are used in electronics systems that transmit from wheel locations to a closer receiver location, information is then typically relayed via hard-wire transmission medium from the RF receiver location to the vehicle cab thus requiring the installation of additional and often expensive communications hardware in a vehicle.

Yet another known method for deriving power for tire monitoring systems relates to scavenging RF beam power with an interrogation antenna in close proximity to a tire and integrated electronic features. Energy that is radiated from the antenna is scavenged to power the electronics, which must often be very specialized ultra-low-power electronics limited to within a few microwatts. Interrogation antennas employed in conjunction with beam-powered electronics must typically be placed in relatively close proximity (within about two feet) to each wheel well due to limited transmission ranges. This typically requires multiple interrogation antennas per vehicle, thus adding to potential equipment costs. Each antenna is also quite susceptible to damage from road hazards, and thus for many reasons may not be the most desirable solution for powering certain tire electronic applications.

The disclosures of all of the foregoing United States patents are hereby fully incorporated into this application for all purposes by reference thereto. While various tire electronics systems and power generation systems therefor have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved system and method for powering electronic systems integrated within a tire structure has been developed.

Piezoelectric technology is utilized to convert mechanical strains associated with tire flexure to electric charge that is then conditioned and stored in one or more energy storage devices. Sufficient accumulations of such stored energy can then power electronic systems including components for identifying various physical tire parameters as well as radio frequency (RF) transmission devices.

In accordance with more particular aspects of the disclosed technology, it is an object of the present subject matter to provide a pneumatic tire with integrated self-powered electronic components. Such electronic components are self-powered by energy harvested from integrated piezoelectric structures, and may correspond with numerous electronic applications. One exemplary electronic application concerns a tire monitoring system designed to measure and transmit information regarding tire conditions such as pressure and temperature, as well as other information such as the number of tire revolutions or general tire identification variables.

Various features and aspects of the subject tire electronics system and specialized power generating device offer a plurality of advantages. The disclosed technology provides for a self-powered tire electronics system that is not dependent on replacement of batteries. Although batteries and battery-operated devices may still be incorporated with aspects of the present subject matter, many complications regarding tire electronics that are solely powered by batteries are obviated in accordance with the disclosed technology.

Another advantage of the present subject matter is that a tire monitoring system is provided that reduces the amount of required signal hardware relative to conventional tire monitoring systems. By providing a tire monitoring system that is self-powered, no scavenger antennas or multiple receiver locations with additional hardwire connections are required. Components of such a tire monitoring system can be integrated within each individual tire structure on a given vehicle such that a single receiver (typically located in a vehicle cabin) is capable of acquiring information transmitted by each tire's integrated electronics.

Yet another advantage of the present subject matter is that there are fewer limitations regarding the type and amount of electronic equipment capable of utilization within tire and wheel assembly structures. Tire electronics powered by conventional methods other than as in accordance with the disclosed piezoelectric technology are often limited to ultra-low power devices. Devices in accordance with the disclosed technology are not necessarily subject to such extreme power limitations. This advantage further facilitates greater functionality of tire electronics, as more components and/or higher-level equipment may potentially be utilized.

A still further advantage of the present subject matter is that the disclosed system and method for generating power and utilizing such power can be used in accordance with a variety of existing applications. Measurement capabilities, monitoring and warning systems, vehicle feedback systems, and asset tracking potential may be possible for applications such as commercial truck fleets, airplanes, and mining/earthmover equipment.

In one exemplary embodiment of the present subject matter, a pneumatic tire assembly with integrated power generation features includes a tire structure, a piezoelectric device, an energy storage device and an electronics assembly. The tire structure is characterized by a crown having an exterior tread portion for making contact with a ground surface, bead portions for seating the tire to a wheel rim, and sidewall portions extending between each bead portion and the crown. The piezoelectric device is configured to generate electric charge therein when the tire structure is subjected to mechanical strains. The energy storage device is coupled to the piezoelectric device to receive and store selected amounts of the electric charge generated in the piezoelectric device. The electronics assembly is coupled to the energy storage device such that selected components of the electronics assembly are powered by electric charge stored in the energy storage device.

In another exemplary embodiment of the present technology, an electronics assembly for integration with a predetermined physical environment includes a piezoelectric device, at least one sensor, and an antenna. The piezoelectric device includes at least one piezoceramic wafer and is configured to generate electric charge therein upon being subjected to mechanical forces. The at least one sensor is powered by electric charge generated within the piezoelectric device and determines information about preselected characteristics of the predetermined physical environment. The antenna is coupled to the at least one sensor for radiating RF signals representative of the determined information about the predetermined characteristics, which in some embodiments corresponds to such information as pressure and temperature. A microcontroller may be provided in some embodiments, also powered by the charge generated in the piezoelectric device and coupled to the at least one sensor for processing information received from the sensor and for generating select information indicative of the preselected characteristics of the predetermined physical environment. In still further embodiments, an RF transmitter may be provided to receive select information from the microcontroller, modulate the information to a carrier signal, and transmit the information via the antenna to a remote receiver location.

A still further exemplary embodiment of the present technology includes a tire structure, a plurality of piezoelectric devices, and at least one energy storage device. The tire structure is characterized by a crown having an exterior tread portion for making contact with a ground surface, bead portions for seating the tire to a wheel rim, and sidewall portions extending between each bead portion and the crown. The plurality of piezoelectric devices are integrated at distributed locations throughout the tire structure and are respectively configured to generate electric charge therein upon the tire structure being subjected to mechanical strains. The at least one energy storage device is coupled to the piezoelectric devices for receiving the electric charge and storing selected amounts therein. In some embodiments, one energy storage device is provided for each piezoelectric device. The one or more energy storage devices may be used to power a centralized electronics module or multiple distinct electronics modules.

In accordance with more particular embodiments of the presently disclosed technology, some embodiments of the aforementioned piezoelectric device(s) may correspond to a fiber composite structure with a plurality of piezoelectric fibers embedded in an epoxy matrix. The piezoelectric device(s) may alternatively include a piezoceramic wafer substantially surrounded by a protective casing and provided with embedded first and second electrical leads for connecting to the piezoceramic wafer (e.g., via electrodes). In still further embodiments, the piezoelectric device(s) include a layer of piezoceramic material with respective conductive layers (e.g., aluminum or stainless steel layers) adhered to opposing sides thereof with a polyimide adhesive (e.g., a high temperature thermoplastic polyimide). Piezoelectric devices may sometimes include multiple piezoelectric elements connected together in series or parallel. Such multiple piezoelectric elements may also be configured with polarization directions that are either in-phase or opposing, and with either d33 or d31 displacement modes.

Additional objects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures).

Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIGS. 7A, 7B, 7C and 7D illustrate respective exemplary configurations of multiple piezoelectric elements in stacked combination for use in a power generation device in accordance with the present subject matter;

Figure 1:
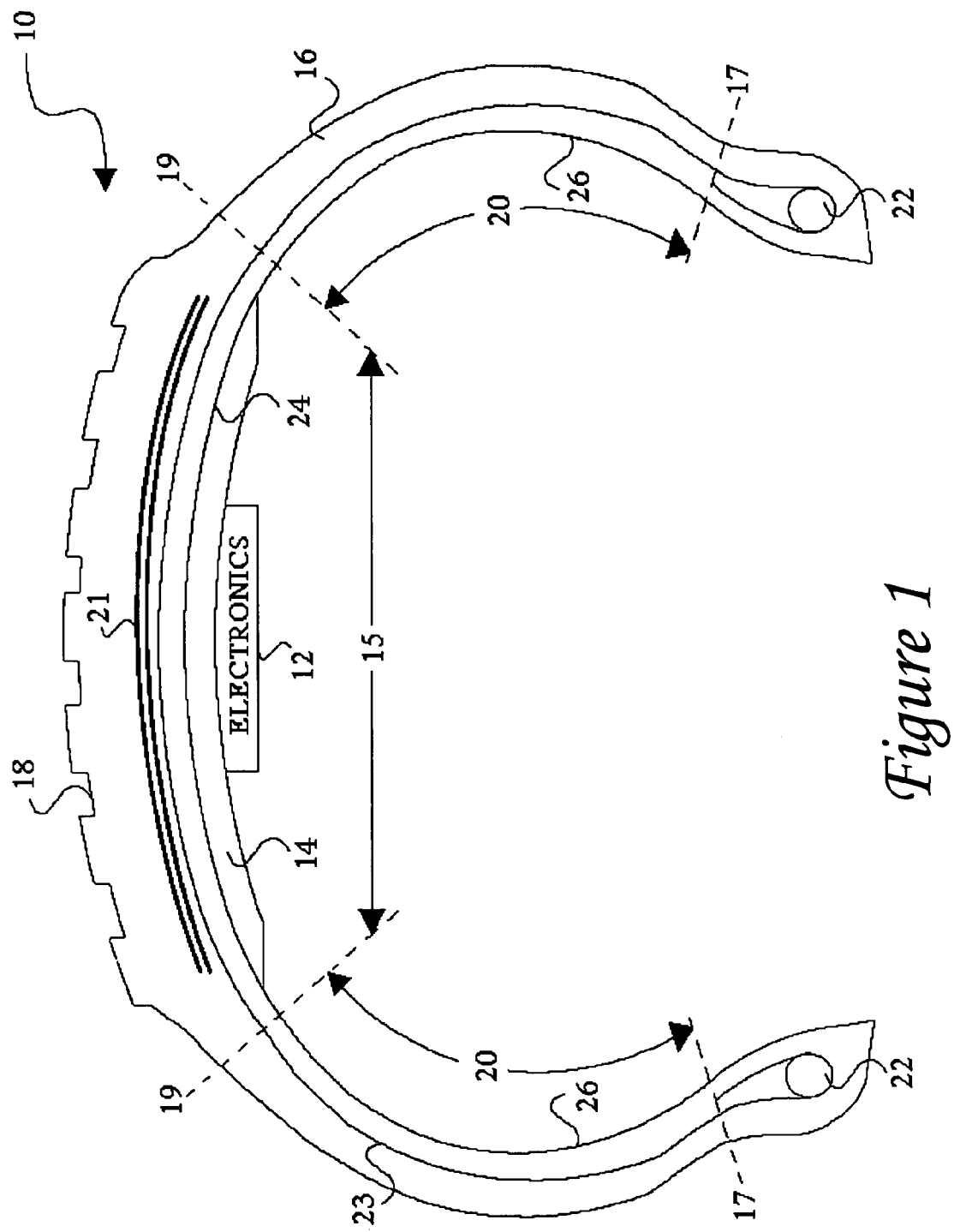
FIG. 1 displays a generally cross-sectional view of an exemplary pneumatic tire structure with integrated self-powered electronic components in accordance with the present subject matter.

Repeat use of reference characters throughout the present specification and appended drawings is intended to represent same or analogous features or elements of the invention. It should be appreciated that various features illustrated in the appended drawings are not necessarily drawn to scale, and thus relative relationships among the features in such drawings should not be limiting the presently disclosed technology.

DETAILED DESCRIPTION OF THE PREFERRED EMBODIMENTS

As discussed in the Summary of the Invention section, the present subject matter is particularly concerned with an improved system and method for powering electronic systems integrated within a tire structure. A power generation device utilizes piezoelectric technology to convert mechanical strain associated with tire flexure to electric current that is then conditioned and stored in an energy storage device. Sufficient accumulations of such stored energy can then power electronic systems, examples of which include components for identifying various physical tire parameters as well as radio frequency (RF) transmission devices.

A power generation device in accordance with the disclosed technology generally includes two exemplary components, a piezoelectric structure and a power conditioning module. Aspects of various exemplary piezoelectric structures are described with reference to FIGS. 2A, 2B and 2C and an exemplary power conditioning module (with energy storage device) is presented in and discussed with reference to FIG. 3. Additional aspects related to exemplary configurations of one or more piezoelectric elements in a power generation device are illustrated in FIGS. 7A–7D, respectively, and in FIGS. 8A and 8B. The output of the power conditioning module may then preferably be used to power electronics systems within a tire or wheel assembly. An example of a tire electronics system, including sensors, a microcontroller, and an RF transmitter is presented in FIG. 5. Aspects of exemplary interaction between a power generation device and tire electronics system is discussed with reference to FIGS. 4A and 4B, respectively. Further aspects of exemplary interaction between multiple piezoelectric elements and one or more tire electronics modules are represented in FIGS. 9A, 9B and 9C. Finally, an exemplary embodiment of a remote receiver configuration for obtaining information transmitted from a tire electronics system is presented with respect to FIG. 6.

Selected combinations of the aforementioned aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function. Similarly, certain process steps may be interchanged or employed in combination with other steps to yield additional exemplary embodiments of a method for generating electric power from a rotating tire's mechanical energy.

Reference will now be made in detail to the presently preferred embodiments of the subject system and method of generating power for electronics systems integrated within a tire or wheel assembly. Referring now to the drawings, FIG. 1 provides a generally cross-sectional view of an exemplary pneumatic tire assembly 10 with integrated self-powered electronic components 12 in accordance with the present subject matter. A power generation device (PGD) 14 is preferably provided in conjunction with electronic components internal to a tire structure 16 such that the electronics components are self-powered within the tire assembly 10.

The capabilities of the subject power generation device with piezoelectric materials, as hereafter presented, offer numerous advantages over conventional techniques for providing power within a tire assembly. Antenna beam power scavenging techniques, as previously discussed, are no longer one of limited options to choose from for powering tire electronics. As such, the functional capabilities of many types of tire electronics are generally increased. The option of utilizing batteries for power generation is no longer essential, thus avoiding costly and cumbersome battery replacement. Although the presently disclosed technology provides for a power generation device that enables antenna beam power and batteries to be eliminated, it should be appreciated that a power generation device could employ a hybrid combination of piezoelectric technology and/or batteries and/or antenna beam scavenging to power different selected electronic components within a wheel assembly.

A typical tire structure 16 is characterized by a crown 15 which supports an exterior tread portion 18 and sidewalls 20 that extend to bead portions 22. Sidewalls 20 generally extend between section lines 17 and 19 and the tire crown 15 generally extends between the two section lines 19. Tire beads 22 are generally provided such that the tire structure 16 can be effectively seated to the rim of a wheel assembly. An inner liner of air-impermeable material forms the interior surface of the tire, including interior crown surface 24 and interior sidewall surfaces 26. A carcass 23 extends between beads 22 across sidewall portions 20 and crown 15, and under inflation pressure defines the tire's shape and transmits forces for traction and steering. Belt package 21 is provided within tire structure 16 generally along the crown 15.

PGD 14, as illustrated in the exemplary tire assembly embodiment of FIG. 1, may be mounted to the interior crown surface 24 of tire structure 16. This location is generally well-suited for actuation of the piezoelectric device within PGD 14 as the exterior tread portion 18 moves along a ground surface and results in flexure of the tire structure 16. This tire flexure coupled with the general mechanical vibrations as the tire assembly 10 moves along a surface enable piezoelectric device within the power generation device 14 to generate electric current, which is then conditioned and stored in an energy storage device for powering the tire electronics 12. Although the interior crown surface 24 is a logical location for mounting power generation device 14, it should be appreciated that PGD 14 may also be mounted to a location such as an interior sidewall surface 26. Such location may offer less strain on the piezoelectric elements within the subject PGD 14 while still providing enough power generation for certain electronic applications. Further, PGD 14 could be mounted and cured within tire structure 16, for example, between carcass 23 and the inner liner provided along surfaces 24 and/or 26. In accordance with the variety of possible locations for PGD 14, it should be understood that the term "integrated" generally encompasses all possible locations, including being mounted on or in a tire structure.

PGD 14 generally comprises two main components, a piezoelectric device and a power conditioning module. The piezoelectric device is subjected to mechanical strains caused by tire rotation, thereby generating charge in one or more piezoelectric elements (as should be understood by one of ordinary skill in the related art). This electric charge is then preferably provided to a power conditioning module where the resulting current is rectified, conditioned, and stored for use with power electronics.

The piezoelectric device could comprise a variety of piezoelectric materials, including but not limited to barium titanate, polyvinylidene fluoride (PVDF), lead zirconate titanate (PZT) crystals, or PZT fibers. A particular type of piezoelectric material that may be utilized in accordance with the subject power generation device is a piezoelectric fiber composite structure, such as those disclosed in U.S. Pat. Nos. 5,869,189 and 6,048,622 issued to Hagood, IV et al., hereby incorporated by reference for all purposes. A similar example of such Active Fiber Composites (AFCs) that may be utilized in accordance with the present subject matter corresponds to "PiezoFlex" brand technology, such as offered for sale by Continuum Control Corporation.

Figure 2A:
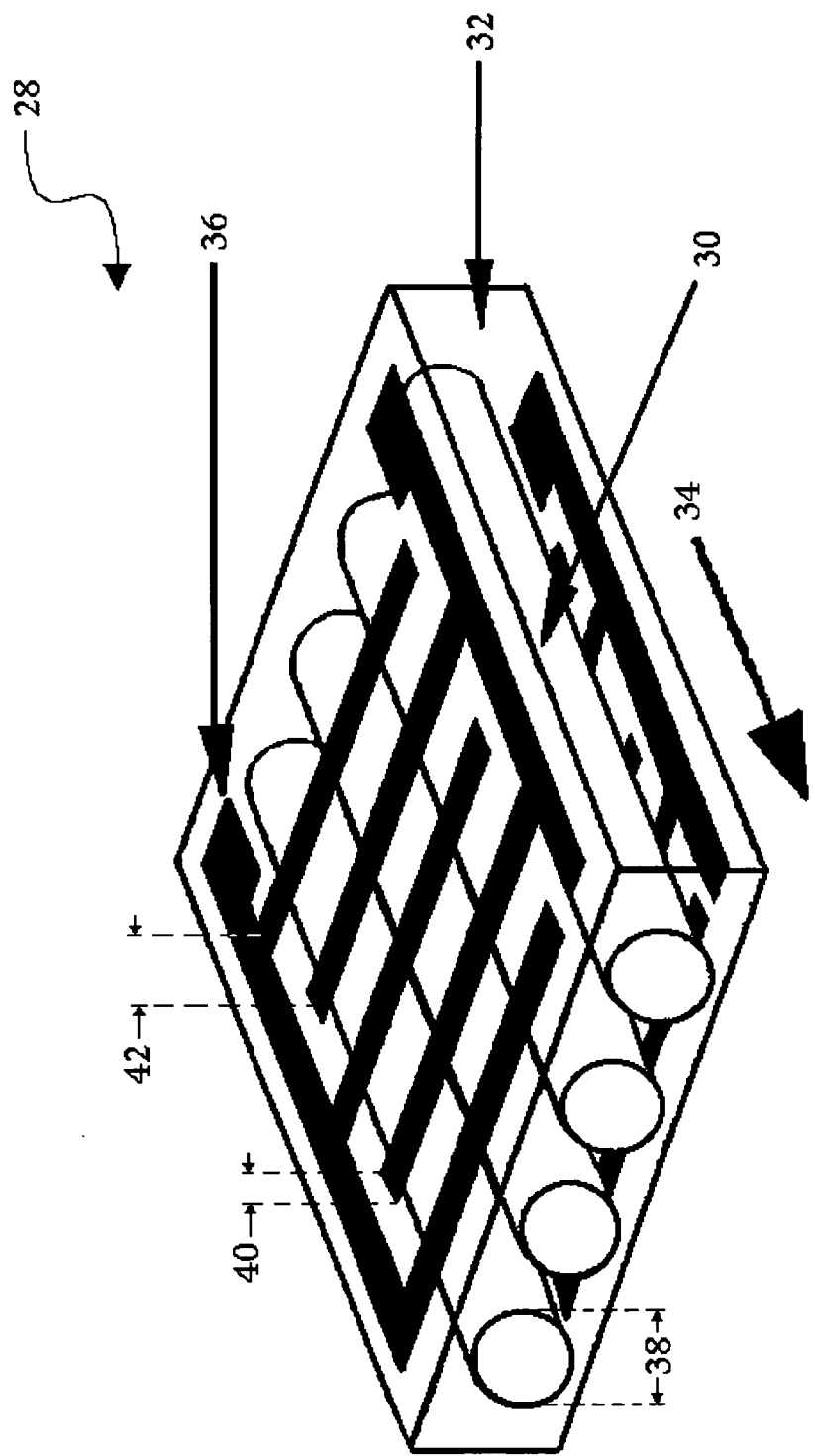
FIG. 2A displays a generally perspective view of a first exemplary piezoelectric structure for use with a power generation device in accordance with the present subject matter.

FIG. 2A displays an isometric view of a piezoelectric AFC structure 28 in accordance with exemplary aspects of the presently disclosed power generation device. Such a piezoelectric AFC structure 28 includes a plurality of piezoelectric fibers 30 that are unidirectionally aligned to provide actuation and stiffness of AFC structure 28. The fibers 30 are surrounded by a resin matrix 32 of epoxy or polymer, that provides a damage tolerance through load transfer mechanisms. The piezoelectric fibers have a common poling direction 34 transverse to their substantially co-parallel axial arrangement.

Electrode layers are preferably provided on separate substrates along two opposing surfaces of the fiber/resin matrix configuration to provide electrical input and output to the AFC structure 28. In accordance with the exemplary embodiment of FIG. 2A, electrode layers 36 are configured with an interdigital arrangement with alternating finger-to-finger polarity. Such interdigitated electrode layers 36 may be etched onto separate substrate layers (of polyimide or polyester, for example) using screen-printing techniques as known in the art and conductive ink such as silver-loaded epoxy. The alignment of the interdigital electrode configuration of FIG. 2A is designed to enhance the directionality of the electromechanical response of the AFC structure 28, as well as provide for relatively high charge and coupling coefficients. The amount of resin matrix 32 between electrodes 36 and fibers 30 is preferably minimized to achieve greater performance capabilities.

The orientation of the fibers in an AFC structure relative to a tire structure is a particular design factor in accordance with the subject technology. When orienting the fibers along the circumferential direction of a tire, piezoelectric fibers are subjected to generally high tensile strains, but low compressive strains. Orienting the fiber direction along the radial direction of a tire couples the primary energy harvesting to the radial strains. This orientation is less likely to cause damage to fibers, but yields a potentially higher susceptibility of compressive depoling of the fibers. Thus, orienting a piezoelectric patch of a power generation device of the present subject matter radially versus circumferentially along the summit of a tire structure may be determined based on the size of the patch and the specific tire environment to which it will be subjected. More particularly, optimal placement and orientation of a piezoelectric AFC structure may be based on factors such as maximum power desired per tire cycle, peak tensile and compressive strains along radial versus circumferential mounting directions, and strain uniformity over an AFC structure at given times.

More specific characteristics of a piezoelectric AFC structure, such as the exemplary embodiment of FIG. 2A, can be tailored for different applications. For instance, the piezoelectric fibers may correspond to a variety of different PZT materials, including PZT 5A, PZT 5H, PZT 4, PZT 8, and PMN-33PT. Another specific design constraint corresponds to the diameter 38 of the piezoelectric fibers, which may typically be in a range from about three thousandths of an inch (mils) to about fifteen mils. Other specific dimensions that may be designed for particular applications include the width 40 and pitch 42 of the electrode fingers in interdigital layers 36. An example of electrode finger width 40 corresponds to about twenty-five mils, and an exemplary range for electrode pitch 42 corresponds to from about twenty mils to about one-hundred mils. A specific example of an overall piezoelectric AFC structure for use in accordance with the present subject matter comprises interdigital electrodes with a forty-five mil electrode finger pitch and PZT-5A piezoelectric fibers with a ten mil diameter.

Additional design constraints of a piezoelectric structure for use in a power generation device in accordance with the present subject matter may be considered for certain applications. For instance, there may be certain design constraints relative to the size and processing capabilities of a piezoelectric patch for integration within a tire structure. Assume that a PGD in accordance with the disclosed technology comprises a piezoelectric device mounted circumferentially along a tire summit along with an integrated power conditioning module. The PGD is preferably provided in an additional rubber or elastomer casing or supported on a rubber or fiberglass substrate when it is adhered to the tire interior to provide it with additional protection. A rubber casing or substrate additionally provides for facilitated adhesion of the PGD to a tire structure.

In accordance with such exemplary PGD configurations as mentioned above, there is generally no length constraint of the piezoelectric patch; however, testing has shown that patches over seventy mm in length tend to fail. A maximum width of about eighty mm may be desired for certain applications. A maximum thickness of the piezoelectric patch (without a power conditioning module) may be about seven-hundred micrometers, and a maximum mass of about twenty grams (including a piezoelectric patch and a power conditioning module) may be desired for certain applications. In order for the piezoelectric patch to be bonded to a rubber patch for adhering to a tire interior, the patch must generally be able to survive about one-hundred-seventy degrees Celsius for about thirty minutes while subjected to about twenty bar pressure and also to survive about one-hundred-fifty degrees Celsius for about sixty minutes at about twenty bar pressure. It should be appreciated that these specific constraints may change with the advancement of pertinent materials and adhesion technologies. In addition, a PGD in accordance with the present subject matter should preferably be able to withstand operating conditions from about negative forty degrees Celsius to about one-hundred-twenty-five degrees Celsius, a maximum tire speed of about one-hundred-sixty kph, and an endurance of either about ten years or seven-hundred-thousand miles.

Yet another type of piezoelectric patch that may be utilized in PGD 14 in accordance with some embodiments of the present invention corresponds to generally solid piezoeceramic wafers. Such piezoceramic wafers may be single-crystal or polycrystalline structures, including but not limited to wafers made of polycrystalline ferroelectric materials such as barium titanate ($BaTiO_3$) and lead zirconate titanate (PZT).

Figure 2B:
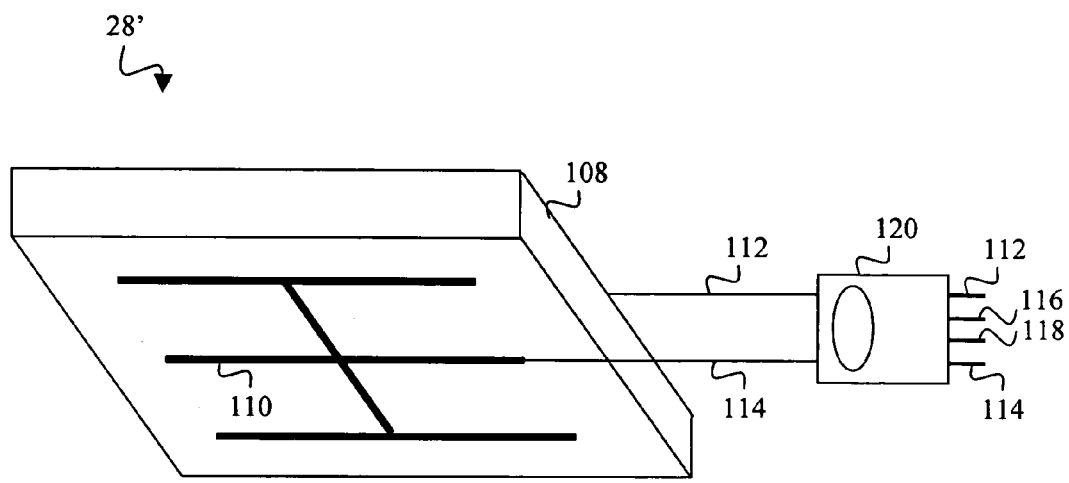
FIG. 2B displays a generally perspective view of a second exemplary piezoelectric structure for use with a power generation device in accordance with the present subject matter.

Referring now to FIG. 2B, a more particular example of a potential piezoelectric device 28' for use in a power generation device 14 of the presently disclosed technology is illustrated. Piezoelectric device 28' corresponds to one or more piezoceramic wafers provided in one of a unimorph, bimorph or stacked/sandwich arrangement and packaged within a protective skin 108. A unimorph arrangement generally corresponds to a single modular portion (i.e., layer) of piezoceramic material, which may be bonded to an inactive substrate in some embodiments. A bimorph arrangement generally corresponds to two modular portions (i.e., layers) of piezoceramic material that are bonded to opposing sides of a center metallic shim layer, and a stacked, or sandwich, arrangement corresponds to several piezoelectric elements provided adjacent to and coupled with one another. Bimorph and stacked arrangements may yield a higher level of generated charge versus amount of mechanical displacement than unimorph arrangements for certain applications.

Referring still to FIG. 2B, the protective casing 108 in which one or more piezoceramic wafers may be provided may serve as electrical insulation for the piezoceramic wafers as well as a defense against humidity and potentially harsh contaminants. In some embodiments, the piezoceramic wafers may comprise specific PZT materials such as PZT-5A and/or PZT-5H. Distributed electrodes 110 may be made of such material such as nickel and may be provided on top and bottom surfaces of the assembly for coupling to pre-attached first and second electrical leads 112 and 114, respectively. Pins for connecting to leads 112 and 114 may be accessible via a connector element 120 for a reliable component with no soldered wires. Additional pins at connector element 120 may provide respective electrical connections 116 and 118 for poling the piezoceramic element(s) within piezoelectric device 28'. A specific example of the type of piezoelectric device represented in FIG. 2B and that may be utilized in accordance with the present subject matter corresponds to "QuickPack" brand technology (e.g., ACX QuickPack-PowerAct QP15W), such as offered for sale by Midé Technology Corporation.

Figure 2C:
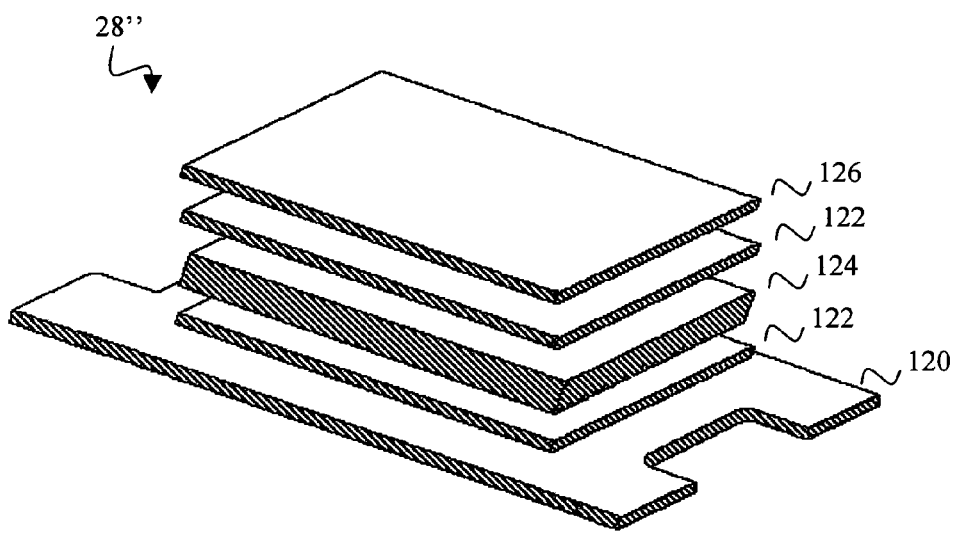
FIG. 2C displays a generally exploded perspective view of a third exemplary piezoelectric structure for use with a power generation device in accordance with the present subject matter.

A still further example of a piezoelectric device for use in a power generation device in accordance with the present subject matter is represented in FIG. 2C as element 28". FIG. 2C depicts a generally exploded perspective view of a piezoelectric element 28", including multiple layers provided in a generally stacked arrangement in which individual materials are layered on top of one another. A first layer in the layered composite comprising piezoelectric element 28" corresponds to a metal substrate layer 120, for example but not limited to a layer of stainless steel. Subsequent adhesive layers 122 are provided around an internal layer 124 of piezoelectric material. Piezoelectric layer 124 may correspond in some embodiments to a piezoceramic material such as PZT. Adhesive layers 122 may in some embodiments comprise a polyimide material or more specifically a high temperature thermoplastic polyimide (e.g., LaRC™-SI brand material such as developed by NASA's Langley Research Center). A top layer 126 of piezoelectric element 28" comprises a metallic material such as but not limited to aluminum. Such multiple layers may be combined together by placing the entire assembly in an autoclave in which the multiple layers are heated, squeezed together, allowed to cook, and then cooled to around room temperature. As the piezoelectric element 28' begins to cool, the substrate layer 120 which is bonded to piezoceramic layer 124 acts to keep piezoceramic layer 124 in compression while is itself in a continuous state of tension. This induced pre-stress may cause the piezoelectric device to be ultimately formed in a slightly curved configuration, and allows the finished device to be subjected to much higher levels of mechanical deflection than some conventional piezoelectric devices without cracking.

A specific example of the type of piezoelectric device represented in FIG. 2C and that may be utilized in accordance with the present subject matter corresponds to "THUNDER" brand technology (e.g., Face Thunder Actuator 6R), such as offered for sale by Face International Corporation. THUNDER products generally correspond to T̲hin Layer U̲nimorph Ferroelectric D̲river and Se̲nso̲r devices that are made of multiple layers of material held together in a "sandwich-like" package with high strength bonding materials configured to provide internal pre-stresses. The adhesive layers 122 of piezoelectric element 28" hold the various device layers together despite relatively high internal stresses that are created during device manufacturing.

It should be appreciated that variations to the exemplary piezoelectric devices discussed above for incorporation with a power generation device of the present subject matter as appreciated by one of ordinary skill in the art may be implemented, and that such variations are within the spirit and scope of the present invention. For example, although the piezoelectric elements presented herein are generally rectangular in shape, it should be appreciated that piezoelectric elements of different shapes such as circular, square or otherwise may also be utilized. Additional modifications to the geometry, dimensions, material type, etc. of the piezoelectric elements are generally considered within the purview of one of ordinary skill in the art.

Still further design aspects that may be implemented in accordance with the present technology concern combination of multiple piezoelectric elements, such as now discussed with reference to FIGS. 7A–7D and 8A–8B respectively. FIGS. 7A–7D illustrate respective exemplary configurations of how multiple elements 130 may be stacked vertically inside a tire PGD. Although only two piezoelectric elements 130 are illustrated in each configuration of FIGS. 7A–7D, it should be appreciated that more than two piezoelectric elements may be utilized. Pieozoelectric elements 130 may correspond to single-crystal or polycrystalline piezoceramic wafers, including but not limited to wafers made of polycrystalline ferroelectric materials such as barium titanate ($BaTiO_3$) and lead zirconate titanate (PZT). Although not illustrated in FIGS. 7A–7D, it should be appreciated that a center conductive shim layer may be provided in between each adjacent piezoelectric element 130, such as characteristic of some bimorph and stacked piezoelectric arrangements.

The various configurations depicted in FIGS. 7A–7D illustrate different poling and displacement modes for the combined piezoelectric elements 130. Shorter arrows 132 and 134 within each piezoelectric element 130 represent the poling direction in each piezoelectric element, generally pointing from the positive to the negative poling electrode to which a high DC voltage would have been applied during manufacture of such pieozelectric elements 130. Although not limited to the exemplary poling configurations shown in FIGS. 7A–7D, all such piezoelectric elements 130 are characterized by polarization vectors 132 and 134 that are generally parallel to the reference 3-axis. FIGS. 7B and 7D respectively illustrate configurations with both piezoelectric elements 130 having polarization vectors that are in-phase, while FIGS. 7A and 7D respectively illustrate configurations with both piezoelectric elements 130 having polarization vectors that are opposing, or out of phase. The piezoelectric configurations of FIGS. 7A and 7B are both in d33 mode, wherein displacement forces (represented by arrows 136) correspond to an expansion in the same direction as the electrical field and the poling direction. The piezoelectric configurations of FIGS. 7C and 7D are both in d31 mode, wherein displacement forces (represented by arrows 138) correspond to a contraction perpendicular to the electrical field and the poling direction.

The configurations of FIGS. 7A–7D illustrate respective examples of how more piezoelectric material can be provided in a given strain field with the same footprint as a single piezoelectric element. Such an arrangement has the potential to yield more energy output for each rotation of a tire or wheel assembly, as the piezoelectric element(s) pass through the contact patch thereof.

Figure 8A:
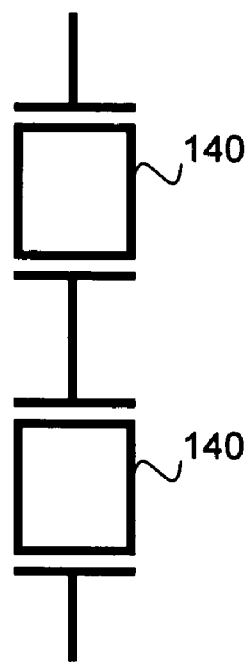
FIGS. 8A and 8B respectively illustrate exemplary configurations of multiple piezoelectric elements in series and parallel combination for use in a power generation device in accordance with the present subject matter.
Figure 8B:
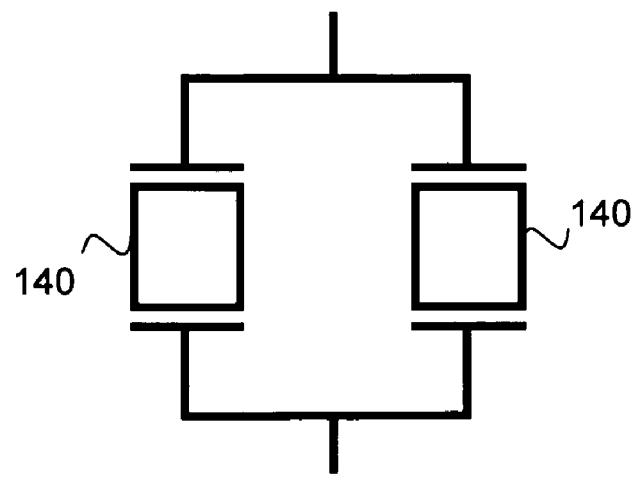
Figure 9A:
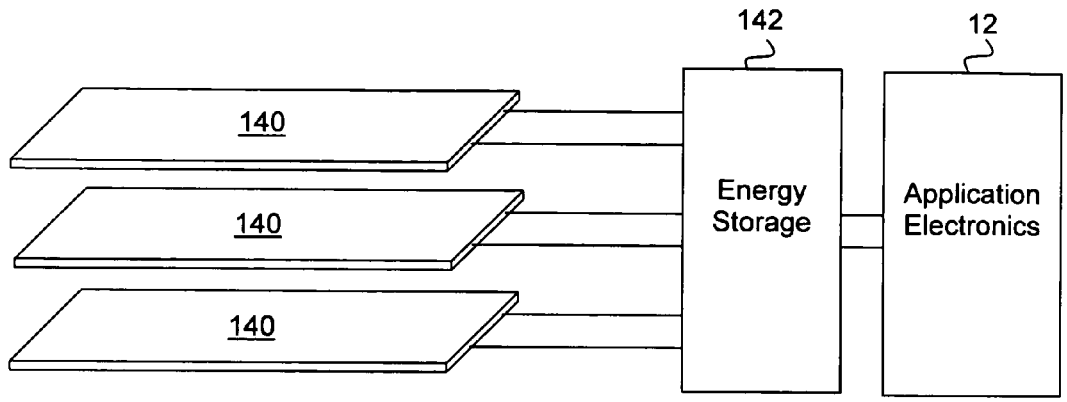
FIGS. 9A, 9B and 9C respectively illustrate exemplary configurations of multiple piezoelectric elements coupled to one or more energy storage devices and one or more application electronics modules in accordance with exemplary power generation device and tire electronics system embodiments of the present technology.
Figure 9B:
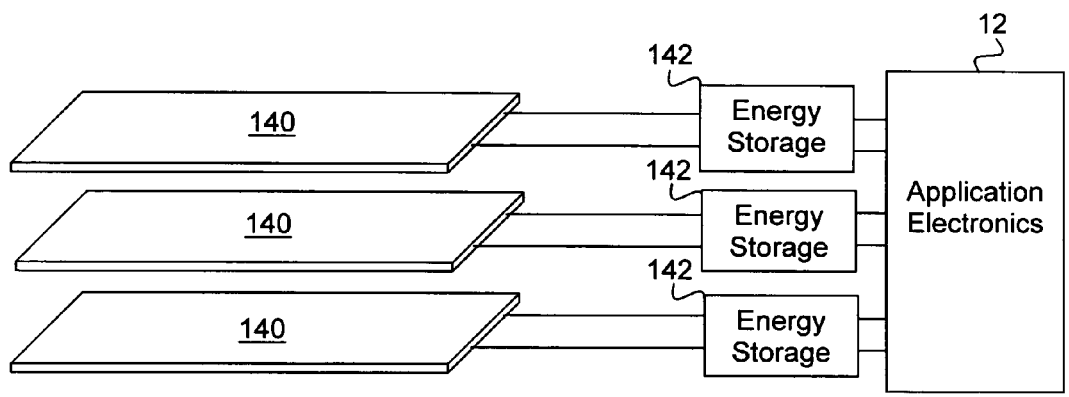
Figure 9C:
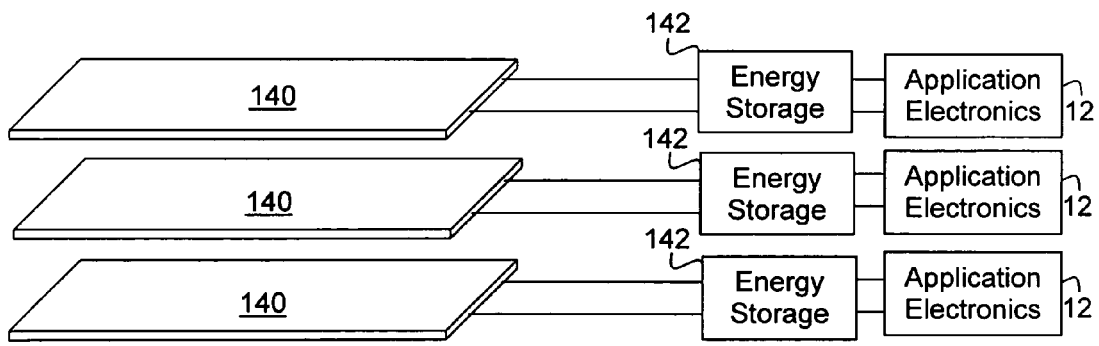

Referring now to FIGS. 8A and 8B, it should be appreciated that piezoelectric elements 140 can be electrically connected in series (such as depicted in FIG. 8A), in parallel (as depicted in FIG. 8B), or in some combination thereof when more than two piezoelectric elements are combined. A series connection among piezoelectric elements 140 provides a generally higher voltage and lower current output than a single piezoelectric element. Such a configuration, as represented in FIG. 8A, may be especially useful for sensing applications, such as detection of tire revolutions as a piezoelectric element passes through the contact patch of a tire or wheel assembly. A parallel connection among piezoelectric elements 140 provides a generally lower voltage and higher current output, which may be especially useful in energy harvesting applications. Such a configuration, as represented in FIG. 8B, helps to reduce energy leakages and may simplify power conditioning electronics. Piezoelectric elements 140 may correspond to such specific piezoelectric elements 28, 28' and 28" as illustrated and discussed with reference to FIGS. 2A, 2B and 2C, respectively, or in other embodiments as piezoceramic wafers such as elements 130 depicted in FIGS. 7A–7D, respectively.

Figure 3:
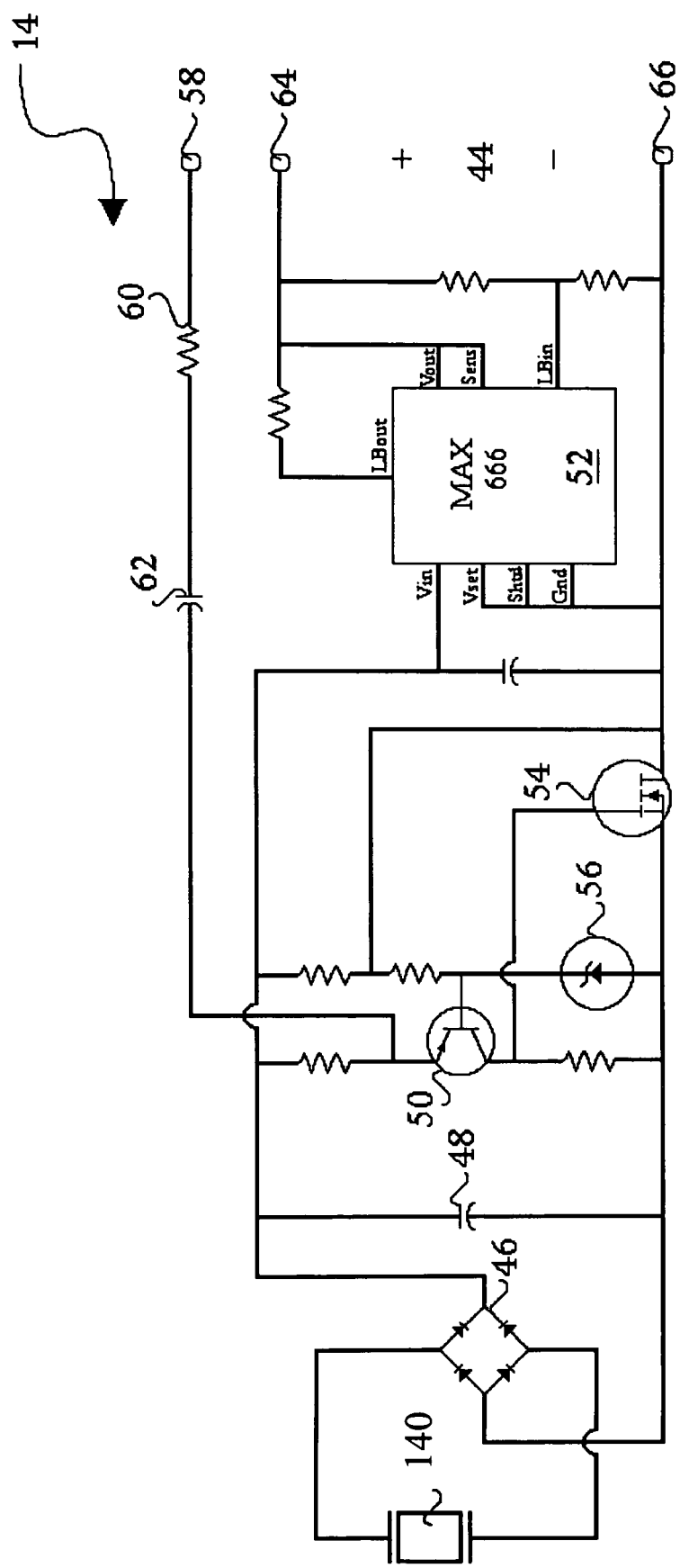
FIG. 3 provides a schematic representation of additional exemplary aspects of a power generation device in accordance with the present subject matter, particularly regarding an exemplary power conditioning module.

The second main component of PGD 14, in addition to a piezoelectric element is a power conditioning module, an exemplary embodiment of which is represented in FIG. 3. The major functionality of a power conditioning module in accordance with the present subject matter is to rectify, condition and store the electric charge that is generated in the piezoelectric structure 140. In general, power conditioning modules may be particularly designed for different electronics applications for which power is harvested. In accordance with an exemplary embodiment of a tire monitoring system as disclosed in the present specification, the exemplary power conditioning module of FIG. 3 is designed according to certain dynamic energy requirements. In particular, the exemplary power conditioning module of FIG. 3 is designed such that the voltage output 44 is generally about five volts, the maximum ripple of output voltage 44 is within ±ten mvolts, the minimum duty cycle of output voltage 44 is about sixty seconds, and the maximum duty cycle of output voltage 44 is about five seconds. Additional design requirements within which the exemplary power conditioning module embodiment of FIG. 3 operates correspond to a maximum energy requirement into an electronics system of about four mJoules and a time duration for which an electronics system can operate between about twenty-five msec and about two-hundred msec, depending on the functionality of the electronics system.

With further reference to the exemplary power conditioning module of FIG. 3, one or more piezoelectric elements 140 are connected in parallel with a rectifier, for example full-bridge rectifier 46. Alternative rectifier configurations could correspond to a doubling rectifier or an N-stage voltage multiplier. The rectified signal from rectifier 46 is then stored in electrolytic capacitor 48. A specific example of an electrolytic capacitor 48 suitable for employment in the exemplary power conditioning module of FIG. 3 corresponds to a Panasonic TEL series tantalum capacitor with a capacitance of about forty-seven µFarads. Other specific electrolytic capacitors may similarly be suitable for utilization as a storage element in accordance with the disclosed power conditioning module. Other energy storage elements, such as rechargeable batteries or super capacitors, may provide a suitable alternative in certain applications as an energy storage device for a power conditioning module.

Once a sufficient amount of energy has accumulated in electrolytic capacitor 48 (or other suitable energy storage device), an FET transistor 50 acts as a switch to release the stored energy in capacitor 48 to a voltage regulator 52. An example of a voltage regulator suitable for use in the exemplary embodiment of FIG. 3 is a dual-mode five-volt programmable micropower voltage regulator such as the MAX666 brand offered for sale by Maxim Integrated Products. Such a voltage regulator is ideally suited for electronics systems that may typically have been battery-powered systems, and effectively convert the voltage across capacitor 48 to a regulated five volt output voltage 44. A diffusion metal oxide semiconductor (DMOS) FET transistor 54 and zener diode 56 are additionally provided in the exemplary power conditioning module of FIG. 3.

Initially, transistors 50 and 54 are off, and the ground at the drain of transistor 54 is floating such that no output voltage 44 is provided. As capacitor 48 charges to a sufficient voltage level (determined by zener diode 56 and the base-emitter junction of transistor 50), transistor 50 turns on, activating transistor 54 and latching transistor 50. At this point, capacitor 48 is allowed to discharge through the circuitry providing a five volt regulated output 44 to an electronics system. Typically, when the application electronics to which output voltage 44 is supplied has finished its useful work, the electronics system sends a signal back at signal path 58, through resistor 60 and capacitor 62 to turn off field effect transistor (FET) 50 and deactivate transistor 54 such that energy can once again begin to accumulate on capacitor 48.

Figure 4A:
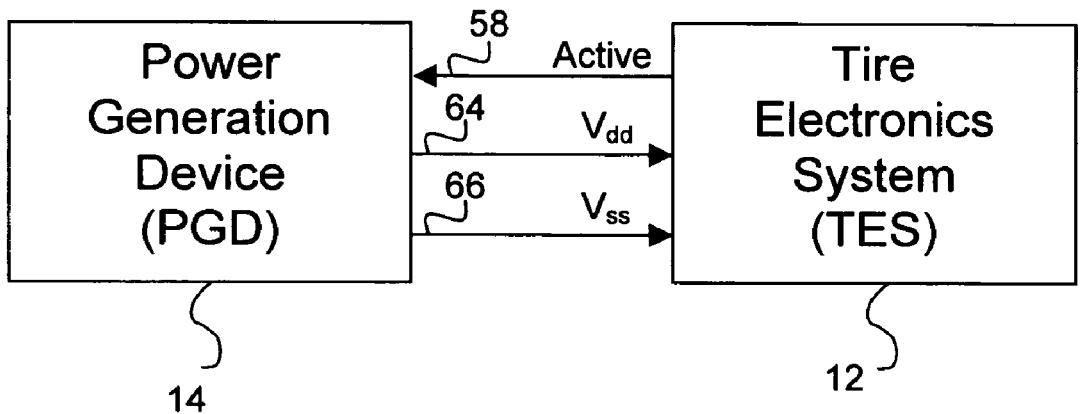
FIG. 4A provides a block diagram representation of exemplary integrated self-powered electronics including a power generation device and a tire electronics system and exemplary interaction thereof in accordance with the present subject matter.
Figure 4B:
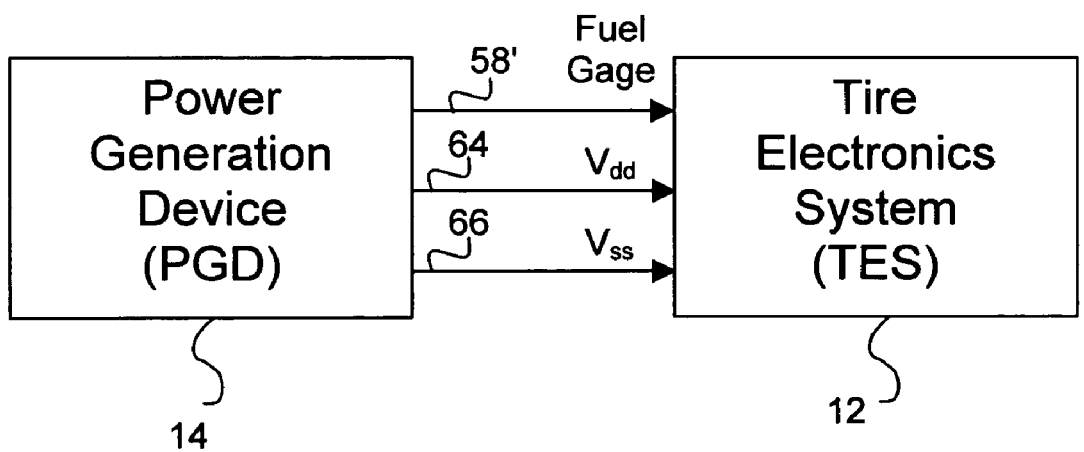
FIG. 4B provides a block diagram representation of exemplary integrated self-powered electronics including a power generation device and a tire electronics system and alternative exemplary interaction thereof in accordance with the present subject matter.

Energy that is generated by PGD 14 may be applied to a variety of different tire electronics systems (TESs) in accordance with the present subject matter. FIGS. 4A and 4B, respectively, illustrate exemplary aspects of interaction between a PGD 14 and TES 12.

In accordance with FIG. 4A, energy is allowed to accumulate on an energy storage device in the PGD (for example, capacitor 48) until a sufficient charge has been obtained to perform the desired fictions in TES 12. Between power cycles, TES 12 remains unpowered, and thus the activation of TES 12 is governed by the rate at which energy is accumulated in the energy storage device of PGD 14. When sufficient energy is accumulated in PGD 14, a supply voltage "$V_{dd}$" and ground voltage "$V_{ss}$" will be provided at paths 64 and 66 respectively to TES 12. TES 12 will return an "Active" signal along path 58 indicating electronics in TES 12 are currently functioning. When the given electronics in TES 12 are done with their respective tasks, then the "Active" signal goes low and the energy storage device in PGD 14 once again accumulates energy. This cycle will repeat as long as a tire assembly rotates at or above a given threshold speed, which may generally be about twenty kph.

In accordance with the exemplary interaction presented and discussed with reference to FIG. 4B, PGD 14 continuously provides voltage "$V_{dd}$" and ground "$V_{ss}$" signals to TES 12 along with a "Fuel Gage" signal representative of the amount of energy stored in PGD 14. When power is applied to TES 12, a microprocessor or other suitable electronic component can periodically activate itself and monitor the Fuel Gage signal from PGD 14. If a sufficient amount of energy is available in the energy storage device of PGD 14, then TES 12 will engage in a specified task. If a sufficient amount of energy is not available, then TES 12 will go into a low power mode where it consumes less than about one µA of power. The Fuel Gage signal is thereafter periodically checked until energy accumulation is sufficient. This cycle of waiting for sufficient energy accumulation, engaging in a specified task, and returning to low power mode is preferably repeated in a continuous fashion as long as the tire is rotating at or above a given threshold speed.

As previously mentioned, TES 12 could comprise a variety of different electronic applications depending on what sort of components are included in a tire or wheel assembly. A specific example of a tire electronic system 12 corresponds to a tire monitoring system, such as hereafter discussed with reference to FIG. 5. In particular, the tire monitoring system of FIG. 5 measures temperature and pressure within a tire structure and sends the results by means of a radio frequency (RF) transmitter 68 to a remote receiver location. An example of respective transmitter and receiver modules for utilization with aspects of the disclosed technology corresponds to respective TX2 and RX2 brand UHF FM Data Transmitter and Receiver Modules such as offered for sale by Radiometrix Ltd.

A five-volt power signal "$V_{dd}$", ground signal "$V_{ss}$", and either an "Active"or "Fuel Gage" signal as discussed with reference to FIGS. 4A and 4B are preferably provided from PGD 14 to a microcontroller 70. An example of a suitable microcontroller for use with the disclosed technology is a Microchip brand PIC16LF876 28-pin CMOS RISC microcontroller. Microcontroller 70 is activated when power is applied at input path 64 and then applies power to both temperature sensor 72 and pressure sensor 74 (as well as any additional sensors or appropriate electronic devices in TES 12). An example of a temperature sensor 72 suitable for utilization with the disclosed technology is a LM50 SOT-23 Single-Supply Centigrade Temperature Sensor such as offered for sale by National Semiconductor. An example of a pressure sensor 74 suitable for utilization with the disclosed technology is a Model 1471 PC Board Mountable Pressure Sensor such as offered for sale by ICSensors and Measurement Specialties Inc. Additional sensors 76, 78 and 80, respectively, may measure additional characteristics of a tire structure or corresponding wheel assembly.

Figure 5:
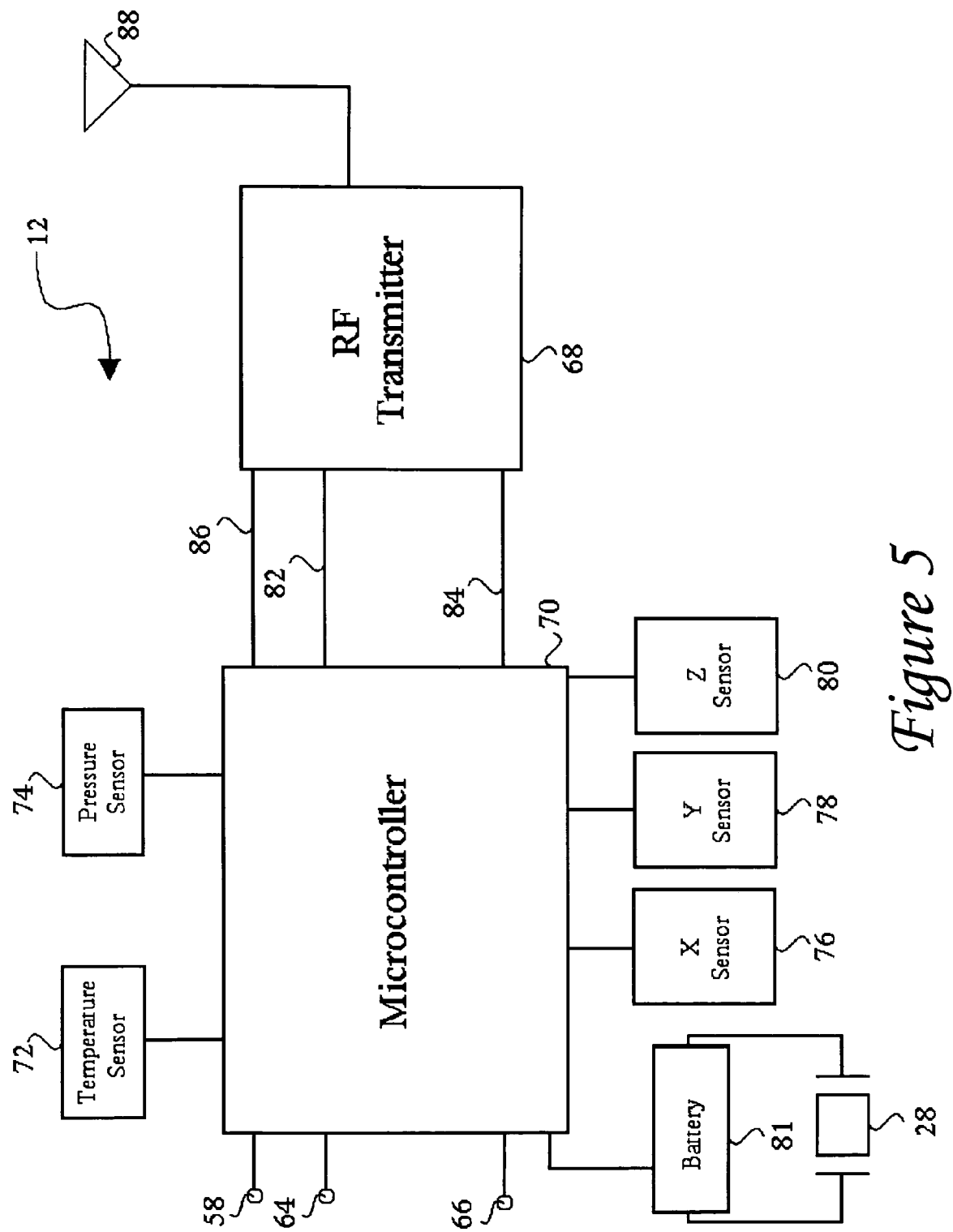
FIG. 5 provides a block diagram representation of an exemplary tire electronics system in accordance with the disclosed technology.

Yet another component of the exemplary TES embodiment 12 of FIG. 5 corresponds to a rechargeable battery 81 that may also be configured to receive electric charge generated within piezoelectric structure 28 of PGD 14 and to store additional energy for the integrated tire electronics. Energy stored in battery 81 can typically be stored for a much longer period of time than in other storage devices such as exemplary capacitor 48. Energy stored in battery 81 can be provided to microcontroller 70 when not enough power is generated by actuation of the piezoelectric device. Such a situation could occur, for instance, when the vehicle is stationary or when the tires are removed from a vehicle. For example, stored energy may be needed to power TES 12 when a ground crew checks the air pressure in stationary tires on a commercial airliner. Also, battery 81 may serve to provide power to TES 12 such that information for managing tire inventories or retreads is available when a tire is removed from the vehicle.

With further reference to the exemplary TES embodiment 12 of FIG. 5, microcontroller 70 preferably includes an analog-to-digital (A/D) converter that receives information from sensors 72 through 80, respectively, and converts it to digital information. Microcontroller 70 also comprises memory, preferably non-volatile EEPROM, which stores a unique identification tag that provides sufficient information to identify the tire or wheel assembly. Such an identification variable may be especially useful in tracking tires and vehicles in commercial applications such as trucking fleets, airplanes, etc. Once the desired information, such as that provided by sensors 72 through 80 respectively, is acquired by microcontroller 70 and converted to digital information, microcontroller 70 preferably shuts off power to the sensors and turns on power to RF transmitter 68 at lines 82 and 84 respectively. The desired digitized information is then output on data line 86 to RF transmitter 68, where the data is modulated onto an FM carrier signal and transmitted via antenna 88 to a remote receiver location.

Figure 6:
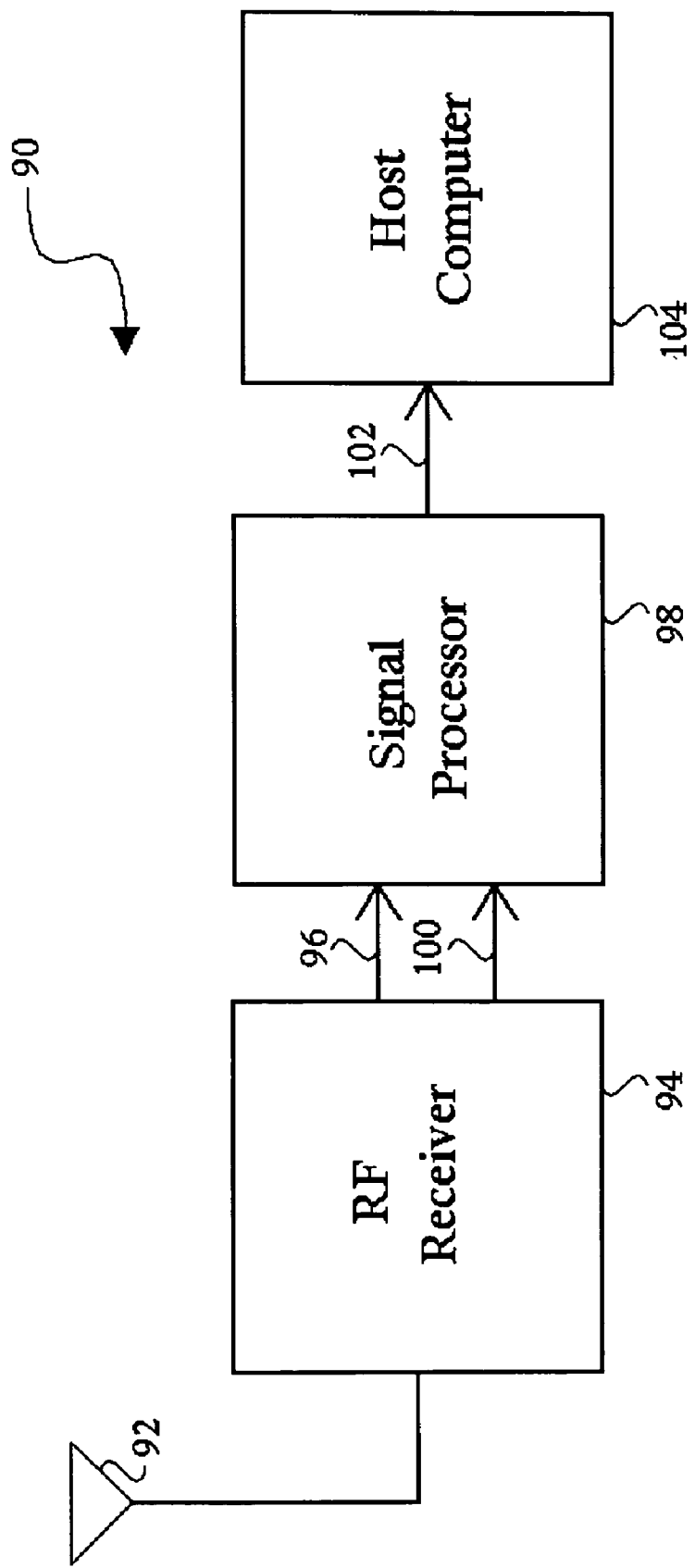
FIG. 6 provides a block diagram representation of an exemplary remote receiver configuration in accordance with the present subject matter.

A vehicle employing tire assemblies with self-powered electronics in accordance with the present subject matter are preferably equipped with a single receiver for obtaining the wirelessly transmitted information from each tire assembly. FIG. 6 provides a block diagram representation of an exemplary remote receiver configuration 90 in accordance with the present subject matter. Receiver antenna 92 facilitates receipt of information transmitted from each wheel assembly and relays the information to RF receiver 94, where the received information is demodulated from its carrier signal and provided on path 96 to signal processor 98. A carrier detection signal is also provided from RF receiver 94 to signal processor 98 via signal path 100. The data outputted from RF receiver 94 and the carrier detection signal are preferably multiplied together in signal processor 98 such that a signal without spurious noise is obtained. This data signal with reduced error probability is then preferably routed to a driver circuit that converts the digital signal to a signal with voltage levels suitable for transmission via an RS232 interface 102 to a host computer 104. Terminal emulation software is preferably provided at host computer 104 such that the data received via RS232 interface 102 is converted to information readily usable by an end user, such as that provided on a readable display module.

It should be appreciated in accordance with the disclosed technology that other electronic devices other than those specifically disclosed in the present specification may be utilized with the subject power generation technology. For instance, it may be desired to transmit other types of information other than temperature, pressure and identification to a remote location. Examples include the number of tire revolutions, amount of tire deflection, and vehicle speed. U.S. Pat. No. 5,749,984 discloses other aspects of a tire monitoring system that may be employed with the present subject matter, and such patent is hereby incorporated by reference for all purposes. A tire electronics system may be coupled with a global positioning system (GPS) to pinpoint a vehicle's precise location. A piezoelectric PGD may alternatively be utilized to power light assemblies or feedback systems in a wheel assembly. The number of electronics applications capable of being powered in accordance with aspects of the disclosed technology are vastly numerous and should in no way be limiting to the present subject matter.

It should be further appreciated in accordance with the presently disclosed technology that embodiments of the subject system and method for generating electric power are not limited to one power generation device and one tire electronics module per tire or wheel assembly. The selective combination of multiple elements as disclosed herein should not be limiting to the spirit and scope of the present invention. Referring now to FIGS. 9A, 9B and 9C, different exemplary combinations of features are presented for potential incorporation within a tire, such as depicted in FIG. 1, or corresponding wheel assembly.

Referring now to FIGS. 9A, 9B and 9C, multiple piezoelectric elements 140 may be provided within a tire or wheel assembly. Such piezoelectric elements 140 may be positioned in close proximity to one another within a tire or wheel assembly or may be distributed at different locations throughout the tire or wheel assembly. Piezoelectric elements 140 may in some embodiments comprise such specific exemplary piezoelectric elements 28, 28' and 28" as illustrated and discussed with reference to FIGS. 2A, 2B and 2C, respectively, or in other embodiments may comprise piezoceramic wafers such as elements 130 depicted in FIGS. 7A–7D, respectively. Each piezoelectric element 140 of FIG. 9A generates energy when passed through the contact patch of the tire or wheel assembly to which it is mounted.

Referring particularly to FIG. 9A, the piezoelectric elements 140 may be electrically connected in series or in parallel and are all coupled to a central energy storage module 142. Energy storage module 142 includes selected power conditioning circuitry, such as described in the example of FIG. 3, including an energy storage device such as a capacitor or battery for storing the energy generated by respective piezoelectric elements 140. The single energy storage module 142 is further coupled to an electronics module such as TES 12, such that selected application electronics within TES 12 may receive power stored by energy storage module 142.

Referring particularly to FIGS. 9B and 9C, the distributed piezoelectric elements 140 may be electrically connected in series or in parallel and are each respectively coupled to distinct local energy storage modules 142. Each energy storage module 142 includes selected power conditioning circuitry, such as described in the example of FIG. 3, including an energy storage device such as a capacitor or battery for storing the energy generated by a respective piezoelectric elements 140. Referring to FIG. 9B, the multiple storage modules 142 may be connected electrically in series or parallel to deliver energy to a central electronics module such as TES 12, such that selected application electronics within TES 12 may receive power stored by the energy storage modules 142. Alternatively, as in FIG. 9C, each of the plurality of energy storage modules 142 may deliver energy to a respective local electronics module, such as TES 12. It should be appreciated that the plurality of local electronics modules 12 may be distributed in various locations throughout a tire or wheel assembly and may perform similar functions to one another or may be configured to perform different functions, such as to measure different parameters at distinct respective locations.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A tire assembly with integrated power generation features, said tire assembly comprising:
   a tire structure characterized by a crown having an exterior tread portion for making contact with a ground surface, bead portions for seating said tire to a wheel rim, and sidewall portions extending between each bead portion and the crown;
   a piezoelectric device comprising a layer of piezoceramic material characterized by first and second opposing sides and first and second conductive layers provided adjacent to respective said first and second opposing sides of said layer of piezoceramic material and secured thereto with respective adhesive layers configured to generate electric charge therein upon said tire structure being subjected to mechanical strains;
   an energy storage device coupled to said piezoelectric device for receiving said electric charge from said piezoelectric device and for storing selected amounts of said electric charge therein; and
   an electronics assembly coupled to said energy storage device such that selected electronic components of said electronics assembly are powered by electric charge stored in said energy storage device.

2. A tire assembly with integrated power generation features, said tire assembly comprising:
   a tire structure characterized by a crown having an exterior tread portion for making contact with a ground surface, bead portions for seating said tire to a wheel rim, and sidewall portions extending between each bead portion and the crown;
   a piezoelectric device configured to generate electric charge therein upon said tire structure being subjected to mechanical strains;
   an energy storage device coupled to said piezoelectric device for receiving said electric charge from said piezoelectric device and for storing selected amounts of said electric charge therein; and
   an electronics assembly coupled to said energy storage device such that selected electronic components of said electronics assembly are powered by electric charge stored in said energy storage device,
   wherein said piezoelectric device comprises a fiber composite structure with a plurality of piezoelectric fibers embedded in an epoxy matrix.

3. The tire assembly of claim 1, wherein said piezoelectric device comprises:
   at least one piezoceramic wafer;
   a protective casing substantially surrounding said at least one piezoceramic wafer; and
   first and second electrical leads for connecting to said at least one piezoceramic wafer.

4. The tire assembly of claim 1, wherein said respective adhesive layers comprise thermoplastic polyimide.

5. The tire assembly of claim 1, wherein said first and second conductive layers respectively comprise a material selected from the group consisting of stainless steel and aluminum.

6. A tire assembly with integrated power generation features, said tire assembly comprising:
   a tire structure characterized by a crown having an exterior tread portion for making contact with a ground surface, bead portions for seating said tire to a wheel rim, and sidewall portions extending between each bead portion and the crown;
   a piezoelectric device configured to generate electric charge therein upon said tire structure being subjected to mechanical strains;
   an energy storage device coupled to said piezoelectric device for receiving said electric charge from said piezoelectric device and for storing selected amounts of said electric charge therein; and
   an electronics assembly coupled to said energy storage device such that selected electronic components of said electronics assembly are powered by electric charge stored in said energy storage device,
   wherein said piezoelectric device comprises multiple piezoceramic elements connected in either series or parallel.

7. The tire assembly of claim 6, wherein the polarization directions of said multiple piezoceramic elements are configured as one of in-phase and opposing.

8. The tire assembly of claim 6, wherein the displacement of said multiple piezoceramic elements are configured in one of d33 and d31 modes.

9. The tire assembly of claim 1, wherein said piezoelectric device comprises at least one piezoelectric element comprising a material selected from the group consisting of lead zirconate titanate (PZT), barium titanate, quartz, cadmium sulfide, polyvinylidene fluoride (PVDF) and polyvinyl chloride (PVC).

10. The tire assembly of claim 1, further comprising a power conditioning module provided in conjunction with said energy storage device for rectifying an electric current signal representative of said electric charge generated within said piezoelectric device, providing the rectified current signal to said energy storage device, and generating a regulated voltage output.

11. The tire assembly of claim 1, wherein said electronics assembly comprises a rechargeable battery.

12. The tire assembly of claim 1, wherein said electronics assembly comprises at least one sensor configured to monitor predetermined characteristics of said tire structure.

13. The tire assembly of claim 12, wherein said electronics assembly comprises a radio frequency (RF) device for relaying selected information monitored by said at least one sensor and additional tire identification information to a remote location.

14. The tire assembly of claim 12, wherein said predetermined characteristics include at least one of temperature, pressure, number of tire revolutions, vehicle speed, and level of static and dynamic forces acting on said tire structure.

15. An electronics assembly for integration with a predetermined physical environment, said electronics assembly comprising:
a piezoelectric device comprising a layer of piezoceramic material characterized by first and second opposing sides and first and second conductive layers provided adjacent to respective said first and second opposing sides of said layer of piezoceramic material and secured thereto with respective adhesive layers configured to generate electric charge upon being subjected to mechanical forces, said piezoelectric device comprising at least one piezoceramic wafer;
at least one sensor for determining information about preselected characteristics of said predetermined physical environment, wherein said at least one sensor is powered by the electric charge generated within said piezoelectric device; and
an antenna coupled to said at least one sensor for radiating RF signals representative of said information about preselected characteristics determined by said at least one sensor.

16. The electronics assembly of claim 15, wherein said piezoelectric device comprises:
at least one piezoceramic wafer;
a protective casing substantially surrounding said at least one piezoceramic wafer; and
first and second electrical leads for connecting to said at least one piezoceramic wafer.

17. The electronics assembly of claim 15, wherein said respective adhesive layers comprise thermoplastic polyimide.

18. The electronics assembly of claim 15, wherein said first and second conductive layers respectively comprise a material selected from the group consisting of stainless steel and aluminum.

19. An electronics assembly for integration with a predetermined physical environment, said electronics assembly comprising:
a piezoelectric device configured to generate electric charge upon being subjected to mechanical forces, said piezoelectric device comprising at least one piezoceramic wafer:
at least one sensor for determining information about preselected characteristics of said predetermined physical environment, wherein said at least one sensor is powered by the electric charge generated within said piezoelectric device; and
an antenna coupled to said at least one sensor for radiating RF signals representative of said information about preselected characteristics determined by said at least one sensor,
wherein said piezoelectric device comprises multiple piezoceramic elements connected in series or parallel.

20. The electronics assembly of claim 19, wherein the polarization directions of said multiple piezoceramic elements are configured as one of in-phase and opposing.

21. The electronics assembly of claim 19, wherein the displacement of said multiple piezoceramic elements are configured in one of d33 and d31 modes.

22. The electronics assembly of claim 15, wherein said piezoelectric device comprises at least one piezoelectric element comprising a material selected from the group consisting of lead zirconate titanate (PZT), barium titanate, quartz, cadmium sulfide, polyvinylidene fluoride (PVDF) and polyvinyl chloride (PVC).

23. The electronics assembly of claim 15, wherein said predetermined physical environment corresponds to a tire or wheel assembly.

24. The electronics assembly of claim 15, wherein said at least one sensor provides information about the temperature and pressure within said predetermined physical environment.

25. The electronics assembly of claim 15, further comprising a microcontroller powered by the charge generated in said piezoelectric device and coupled to said at least one sensor for processing information received from said at least one sensor and for generating select information indicative of said preselected characteristics of said predetermined physical environment.

26. The electronics assembly of claim 15, further comprising an RF transmitter coupled to said microcontroller for receiving select information from said microcontroller, modulating the select information to a carrier signal, and transmitting the select information via said antenna to a remote receiver location.

27. A tire assembly with integrated power generation features, comprising:
a tire structure characterized by a crown having an exterior tread portion for making contact with a ground surface, bead portions for seating said tire to a wheel rim, and sidewall portions extending between each bead portion and the crown;
a plurality of piezoelectric devices integrated at distributed locations throughout said tire structure and respectively configured to generate electric charge therein upon said tire structure being subjected to mechanical strains; and
at least one energy storage device coupled to selected of said plurality of piezoelectric devices for receiving said electric charge from said selected of said piurality of piezoelectric device and for storing selected amounts of said electric charge therein,
wherein selected of said plurality of piezoelectric devices comprise a layer of piezoceramic material characterized by first and second opposing sides and first and second conductive layers provided adjacent to respective said first and second opposing sides of said layer of piezoceramic material and secured thereto with respective adhesive layers.

28. The tire assembly of claim 27, further comprising an electronics assembly coupled to said at least one energy storage device such that selected electronic components of said electronics assembly are powered by electric charge stored in said energy storage device.

29. The tire assembly of claim 28, further comprising a plurality of energy storage devices, each of said energy storage devices coupled to one of said plurality of piezoelectric devices for respectively receiving said electric charge from said one of said plurality of piezoelectric devices and storing selected amounts of electric charge therein.

30. The tire assembly of claim 29, further comprising a plurality of distinct electronic modules, selected of said plurality of distinct electronic modules coupled to selected of said respective plurality of energy storage devices such that selected electronic components of said plurality of distinct electronic modules are powered by electric charge stored in said plurality of energy storage devices.

31. A tire assembly with integrated power generation features, comprising:

a tire structure characterized by a crown having an exterior tread portion for making contact with a ground surface, bead portions for seating said tire to a wheel rim, and sidewall portions extending between each bead portion and the crown;

a plurality of piezoelectric devices integrated at distributed locations throughout said tire structure and respectively configured to generate electric charge therein upon said tire structure being subjected to mechanical strains; and at least one energy storage device coupled to selected of said plurality of piezoelectric devices for receiving said electric charge from said selected of said plurality of piezoelectric device and for storing selected amounts of said electric charge therein, wherein selected of said plurality of piezoelectric devices comprises a fiber composite structure with a plurality of piezoelectric fibers embedded in an epoxy matrix.

32. The tire assembly of claim 27, wherein selected of said plurality of piezoelectric devices comprises:
at least one piezoceramic wafer;
a protective casing substantially surrounding said at least one piezoceramic wafer; and
first and second electrical leads for connecting to said at least one piezoceramic wafer.

33. The tire assembly of claim 27, wherein said respective adhesive layers comprise thermoplastic polyimide.

34. The tire assembly of claim 27, wherein said first and second conductive layers respectively comprise a material selected from the group consisting of stainless steel and aluminum.

35. The tire assembly of claim 27, wherein selected of said plurality of piezoelectric devices comprises multiple piezoceramic elements connected in either series or parallel.

36. The tire assembly of claim 35, wherein the polarization directions of said multiple piezoceramic elements are configured as one of in-phase and opposing.

37. The tire assembly of claim 35, wherein the displacement of said multiple piezoceramic elements are configured in one of d33 and d31 modes.

38. The tire assembly of claim 27, wherein each of said plurality of piezoelectric devices comprises at least one piezoelectric element comprising a material selected from the group consisting of lead zirconate titanate (PZT), barium titanate, quartz, cadmium sulfide, polyvinylidene fluoride (PVDF) and polyvinyl chloride (PVC).

39. The tire assembly of claim 27, further comprising a power conditioning module provided in conjunction with said at least one energy storage device for rectifying at least one electric current signal representative of said electric charge generated within each of said plurality of piezoelectric devices, providing the rectified current signal to said at least one energy storage device, and generating a regulated voltage output.

* * * * *